United States Patent [19]

Blomquist

[11] Patent Number: 5,200,882
[45] Date of Patent: Apr. 6, 1993

[54] CIRCUIT BOARD RETAINER

[75] Inventor: Michael L. Blomquist, Newbury Park, Calif.

[73] Assignee: International Electronic Research Corporation, Burbank, Calif.

[21] Appl. No.: 822,417

[22] Filed: Jan. 17, 1992

[51] Int. Cl.⁵ .............................................. H05K 7/20
[52] U.S. Cl. ..................................... 361/386; 211/41; 361/415
[58] Field of Search ............... 174/16.3; 165/80.3, 165/185; 211/41, 89; 361/383, 386–389, 391, 415; 439/64, 325, 327

[56] References Cited

U.S. PATENT DOCUMENTS

| | | | |
|---|---|---|---|
| 3,845,359 | 10/1974 | Fedele | 361/415 |
| 3,975,805 | 8/1976 | Spurling et al. | 211/41 |
| 4,502,601 | 3/1985 | Husted et al. | 211/41 |
| 4,644,444 | 2/1987 | Rush | 361/388 |
| 4,979,073 | 12/1990 | Husted | 361/386 |

Primary Examiner—Gregory D. Thompson
Attorney, Agent, or Firm—Bruce A. Jagger

[57] ABSTRACT

A board retainer assembly including a cold plate with plain generally rectangular grooves for receiving the edge of a board and a board retainer. The retainer being separate from the cold wall and adapted to expand and releasably clamp the edge of a board in the groove against a thermal wall of the groove. The retainer including an elongated body adapted to be received in the groove with an elongated face engaged with the edge of the board. A resilient spring element is adapted to engage the opposite wall of the groove under the urging of a camming rod. The camming rod rotates in the space between the resilient spring element and a camming surface on the body of the retainer. The camming rod is generally oval shaped with a major and a minor axis. Rotation of the camming rod one quarter turn causes the width of the retainer to expand by an amount equal to the difference between the lengths of the major and minor axes. The camming surface has a profile such that a quarter turn of the camming rod which serves to bring expand the width of the retainer also causes the longitudinal axis of the camming rod to shift outward towards the resilient spring element.

7 Claims, 2 Drawing Sheets

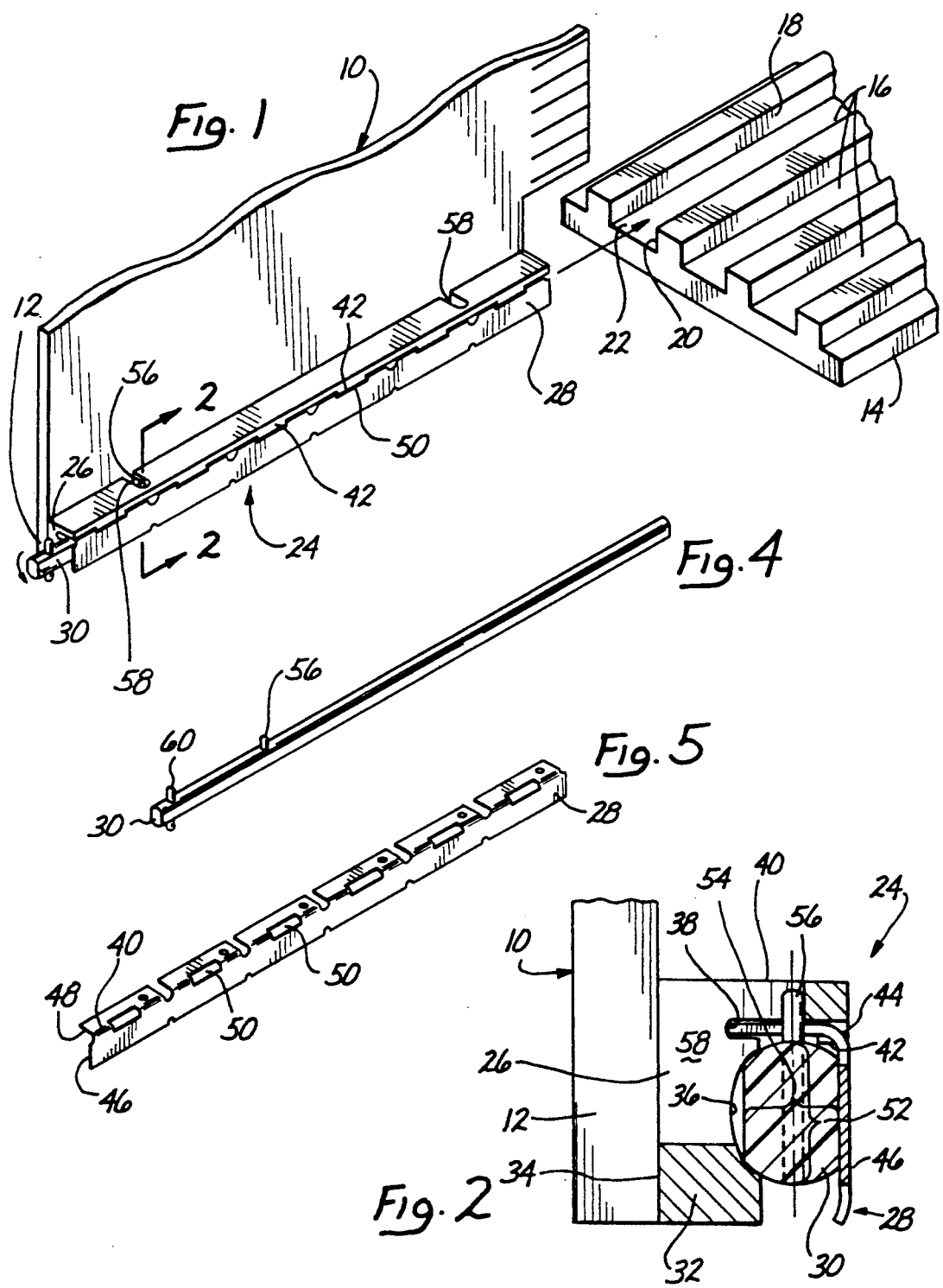

CIRCUIT BOARD RETAINER

BACKGROUND OF THE INVENTION

1. Field of the Invention

The present invention relates to a board retainer; more particularly, it relates to a circuit board retainer where the retainer is adapted to trap the edge of a circuit board or other planar object in a groove or channel within a cold wall.

2. State of the Prior Art

Previously, considerable difficulty had been experienced in adequately retaining printed circuit boards and other planar objects in uniform stress and heat transferring relationship with a preformed groove in a cold wall. U.S. Pat. No. 4,979,073 to Huested, U.S. Pat. No. 4,502,601 to Huested, and U.S. Pat. No. 3,975,805 to Spurling et al. all relate to devices for retaining the edge of a printed circuit board. These prior devices all serve either as stand alone clamps which do not permit or require the use of a groove in a cold wall, or as part of a structure which is machined into a specially configured receptacle in the cold wall. The devices of these prior patents in one form are mounted to the cold wall and provide all of the structure necessary to retain the edge of a circuit board in a heat dissipating relationship. Where it is desired to use a cold wall which has plain rectangular grooves formed in it with separate clamps, the devices of these prior patents are not appropriate. Previous expedients for clamping printed circuit board edges in plain rectangular grooved or slotted cold plates also included the use of wedging devices where wedging force was localized and applied nonuniformly along the retained edge of the board. Also, such prior wedging expedients required careful control of the application of the wedging force and tended to lose some of their wedging force when heated. In general such devices required very careful installation to ensure that they exerted the proper tension on the printed circuit board edge.

SUMMARY OF THE INVENTION

These and other disadvantages of prior art have been overcome according to the present invention. The present invention comprises a board retainer which is adapted to be inserted into a plain rectangular groove in a cold plate along with the edge of a printed circuit board or other planar element. The retainer remains separate from the cold plate and the board. The entire cold wall-retainer-board assembly is held together by the retaining force exerted by the retainer element.

The retainer, according to the present invention, is capable of being expanded by the rotation through approximately one quarter of a revolution of a camming rod. In the expanded configuration, the board retainer, according to the present invention, firmly clamps the edge of the board against a thermal wall of the groove with uniform resilient pressure throughout the length of the groove. The clamping pressure is applied resiliently by means of spring tension so that, as thermal expansion occurs, the edge of the board remains firmly and uniformly clamped to the thermal wall. The uniformity of clamping promotes heat transfer throughout the length of the edge of the board and imposes less stress than would occur from the nonuniform application of pressure.

The board retainer in its relaxed configuration is intended to be inserted freely into the groove in a cold plate and to be retained there in the expanded configuration, together with the edge of a board, by spring force. Upon release, the board and the retainer are generally free to be withdrawn from the channel or groove in the cold plate.

The board retainer, according to the present invention, comprises an elongated body which is adapted to be received in and extend lengthwise of the groove member in a cold plate. The elongated body includes an elongated face element which is adapted to extend generally parallel to and in firm contact with the edge of a board. The opposite side of the board is generally intended to be firmly supported against a first or thermal wall of the groove in the cold plate. That first wall of the cold plate serves as the thermal wall to which heat from the board flows. The elongated face element on the elongated body serves to ensure firm and substantially uniform contact between the edge of the board and the first or thermal wall of the groove in the cold plate. The elongated body also serves to trap and hold a resilient or spring element in operative position. A rotatable rod with a noncircular cross-section is used, in combination with a camming surface on the elongated body, to actuate the resilient or spring element. The rod is similar in configuration to that shown in Huested U.S. Pat. No. 4,502,601.

The resilient element is trapped by the elongated body in such a position that, when actuated by the elongated rod or rotatable camming element, a resilient face of the resilient element flexes outwardly toward and into substantially uniform contact with the length of the second wall of the groove in the cold plate. When the resilient face resiliently engages the second wall, it forces the elongated face of the elongated body into uniform engagement with the edge of the board and thus causes the edge of the board to press firmly and uniformly against the thermal wall.

The rotatable camming element or elongated rod is generally removably retained between the elongated body and the resilient element so that rotation of the elongated rod actuates the resilient element. The elongated rod has a generally race-track shaped cross-section with a major axis extending through the longest part of the cross-section and a minor axis extending perpendicular thereto. The rod is intended to mate with and be retained by a concave camming surface on the elongated body. The camming surface on the elongated body is of such a profile that it causes the longitudinal axis of the rotatable rod to shift outwardly toward the resilient element when the rod is rotated so that its major axis extends between the camming surface and the resilient element. Thus, the difference in the width of the retainer assembly between the relaxed and expanded configurations is greater than would occur if all of the expansion were due to the difference in the lengths between the major and minor axes of the elongated rod. This substantial difference between the relaxed and expanded widths of the retainer permits ease of insertion and removal. The configuration and position of the contact line or area between the camming rod and the resilient element is such that wide tolerances in the width of the groove and the thickness of the board are accommodated without impairing the utility of the retainer.

The resilient or spring element is conveniently formed from an elongated strip of non-magnetic resilient or spring material such as stainless steel or beryllium copper. A longitudinally extending bend is formed in the resilient material to define a foot and a resilient face extending at an angle to the foot. The foot is adapted to be trapped or held together in an assembled configuration with the elongated body by means of appropriately positioned slots and protrusions.

The retainer of the present invention is particularly well suited for use with printed circuit boards; however, it is of equal effectiveness and novelty when applied to other boards and planar objects.

The accompanying drawings are provided for the purposes of illustration only and not limitation. In the drawings there is illustrated:

BRIEF DESCRIPTION OF THE DRAWINGS

FIG. 1, a perspective exploded view of a board retainer assembly according to the present invention;

FIG. 2, a cross-sectional view taken along line 2-2 in FIG. 1;

FIG. 4, a perspective view of the elongated non-circular rotatable camming element used in the retainer assembly of the present invention; and FIG. 5, a perspective view of the resilient element used in the retainer assembly of the present invention.

DETAILED DESCRIPTION OF THE PREFERRED EMBODIMENTS

Figure 3:
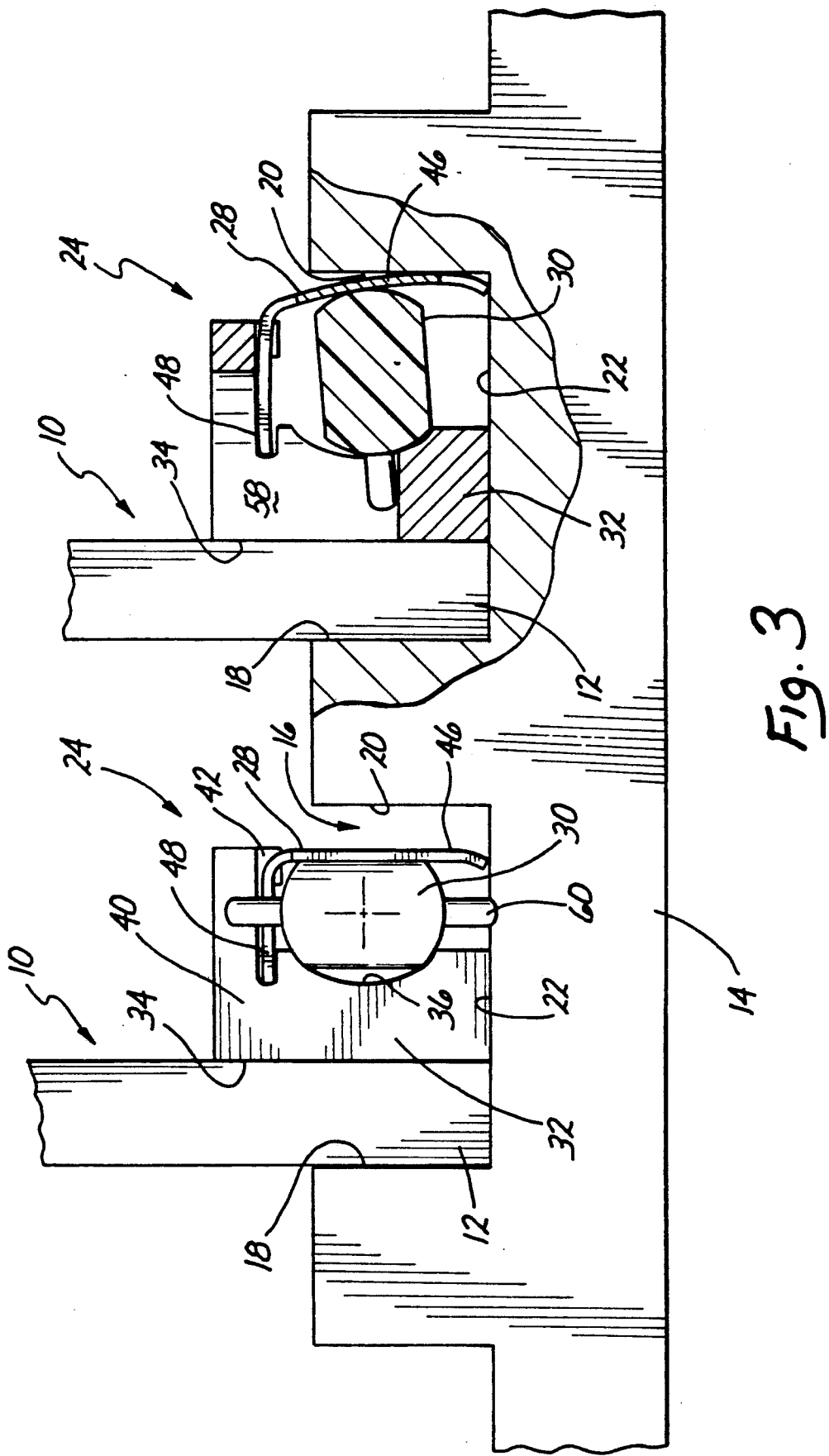
FIG. 3, a side view showing the board retainer of the present invention in relaxed and tensioned configurations.

Referring to the drawings and particularly to FIG. 1 thereof, there is illustrated generally at 10 a board having an edge 12. A cold plate indicated generally at 14 includes a plurality of generally rectangular grooves or channels 16. Each of grooves 16 is provided with a first wall 18, a second wall 20 and a bottom wall 22. A retainer assembly is indicated generally at 24. Retainer assembly 24 includes an elongated body 26 which serves as a housing for resilient element 28 and rotatable camming element or rod 30. Elongated body 26 includes a side wall 32 which provides clamping face 34 on one side and camming surface 36 on the other. Side wall 32 is of sufficient thickness to resist deformation under the loads which are normally encountered in use. Also, it preferably has sufficient mass to absorb and conduct away a significant amount of heat if required to do so by the design of a particular system. A slot 38 is formed in the face of side wall 32 which is opposed to clamping face 34, see particularly FIG. 2. Elongated body 26 has a generally L-shaped configuration which includes base 40 extending outwardly from the side of side wall 32 which is opposed to clamping face 34. Protrusions 42 project outwardly from base 40 in a direction which is generally parallel to clamping face 34.

Resilient element 28 is generally formed from a sheet of resilient or spring material which is formed with a longitudinally extending bend 44, see particularly FIGS. 2 and 5. Bend 44 defines two longitudinal portions which extend at different angles in a generally L-shaped configuration. Resilient face portion 46 is adapted to engage second wall 20 of the groove 16 on its outer side under the urging of camming rod 30 on its inner side. Foot portion 48 is adapted to be received in slot 38 and to engage, by means of ports or openings 50, with protrusions 42. The interengagement of slot 38, base 40 and foot 48 serves to partially retain resilient element 28 in operable association with elongated body 26. The interengagement of ports 50 with protrusions 42 fully traps resilient element 28 so long as rotatable camming element or rod 30, shown in FIG. 4, is installed between resilient face portion 46 and camming surface 36.

Rotatable camming element 30 has a non-circular cross-section. That cross-section has a major axis 52 and a minor axis 54, see particularly FIG. 2. The cross-section of rotatable camming element 30 is generally racetrack or oval shaped. A pin 56 is mounted to camming element or rod 30, and it is adapted to be received in recess 58 in body or housing 26. The cooperation between pin 56 and recess 58 is such that the extent of the rotation of the rotatable camming element 30 is limited to approximately one-quarter of a revolution. Retainer assembly 24 is in its narrowest configuration when camming element 30 is rotated so that minor axis 54 extends between camming surface 36 and resilient face portion 46. As camming element 30 is rotated through approximately 90 degrees, major axis 52 is brought into a position where it extends between camming surface 36 and resilient face portion 46, see particularly, FIGS. 2 and 3. As camming element 30 is rotated from its relaxed to its activated configuration, the longitudinal axis of the camming element shifts towards the resilient face portion 46. Thus, the amount by which resilient face portion 46 is deflected outwardly is greater than the difference between the lengths of the major and minor axes 52 and 54, respectively, as shown on the right hand side in FIG. 3. The outward shift or translation of the longitudinal axis of camming element 30 is caused by the fact that camming surface 36 is quite shallow at its midpoint. The radius of camming surface 36 is such that in the relaxed configuration, the camming element 30 is retained within the retainer assembly. The radius of camming surface 36 at its midpoint is quite large as compared to its endpoints. The fact that camming element or rod 30 is not journaled permits it to shift freely responsive to the action of camming surface 36. The rotation of camming rod 30 is facilitated by the provision of some engaging member such as cross bar 60 on one end of element 30.

The angle between resilient face portion 46 and foot portion 48 on resilient element 28 is such that, when assembled together with elongated body 26, there is a spring tension against the camming rod 30 to hold it in the desired operable position. It may be necessary to accommodate a particular cold wall configuration to switch cross bar 60 from one end of elongated body 26 to the other. Camming rod 30 is exposed enough at the end which bears cross member 60 to permit its being engaged with a simple hand tool and forced out of the space between resilient face portion 46 and camming surface 36. A second recess 58 is provided adjacent the remote end of elongated body 26, see, for example, FIG. 1. Camming rod 30 is reinserted with pin 56 in position to engage with the second recess 58. This ability to switch from one end to the other of elongated body 26 permits the camming rod 30 to be accessed and rotated from either end of elongated body 26. Thus, separate left and right-handed models need not be manufactured. To facilitate this swapping of camming rod 30, the cross-section of the rod is symmetrical about a plane which passes through its longitudinal axis.

In the expanded configuration with the major axis 52 extending between camming surface 36 and resilient face portion 46, the resilient face portion 46 extends substantially beyond the contact line and flexes around the end of major axis 52. The deflection is sufficient so that spring tension is maintained and clamping face 34 is firmly engaged with edge 12 even when the assembly becomes heated and the respective parts of the retainer assembly expand at different rates. Since the elongated body 26, the resilient element 28 and camming rod 30 are substantially coextensive throughout the length of the groove member 16, the clamping forces are substantially uniform throughout the entire length of edge 12.

What has been described are preferred embodiments in which modifications and changes may be made, including reversal, transposition, and substitution of parts, as will be understood by those skilled in the art, without departing from the spirit and scope of the accompanying claims.

What is claimed is:

1. A board retainer assembly comprising:
a cold plate, a groove in said plate, said groove defined by generally parallel opposed first and second walls receive an edge of a board and a board retainer, said retainer expanding and releasably clamping said edge in said groove, said retainer including an elongated body received in said groove, said elongated body including an elongated face extending generally parallel to and spaced a predetermined distance from said first wall, a camming surface on said elongated body, a rotatable camming element in camming relationship with said camming surface, a resilient element mounted to said elongated body in operative association with said rotatable camming element for engaging said second wall and biasing said elongated face toward said first wall when actuated by said camming element.

2. The board retainer assembly of claim 1 including a plurality of groove extending generally parallel to one another in said cold plate.

3. The board retainer assembly of claim 1 wherein said rotatable camming element comprises an elongated rod having a generally race track shaped cross section which cross section has a major axis and a minor axis, said elongated rod being mounted between said camming surface and said resilient element for rotation around a longitudinal axis, said elongated rod being mounted with said minor axis extending generally between said camming surface and said resilient element, whereby rotation of said elongated rod through approximately ninety degrees causes said major axis to extend generally between said camming surface and said resilient element, said camming surface having a profile which causes said longitudinal axis to shift toward said resilient element as said elongated rod is rotated toward a position where said major axis extends generally between said camming surface and said resilient clement.

4. The board retainer assembly of claim 1 wherein said resilient element is an elongated strip of resilient material generally formed around a longitudinally extending bend to define a foot position and a resilient face position extending at an angle to said foot position, said foot position being trapped by said elongated body, said resilient face position resiliently engaging said second wall responsive to the urging of said elongated rod.

5. The board retainer assembly of claim 4 wherein a longitudinal edge of said foot position which is remote from said bend is received in a slot formed in said elongated body and ports defined in said foot position receive mating protrusions extending toward said foot position from said elongated body.

6. The board retainer assembly of claim 1 wherein said retainer is generally substantially longitudinally coextensive with said groove.

7. The board retainer assembly of claim 6 wherein said elongated body, elongated rod and resilient element are generally longitudinally coextensive with one another whereby the clamping force generated by said retainer is distributed substantially uniformly along said edge.

* * * * *